(12) United States Patent
Wu

(10) Patent No.: US 11,073,549 B2
(45) Date of Patent: Jul. 27, 2021

(54) DISPLAY PANEL TEST CIRCUIT AND DISPLAY PANEL TEST DEVICE

(71) Applicants: HKC Corporation Limited, Guangdong (CN); Chongqing HKC Optoelectronics Technology Co., Ltd., Chongqing (CN)

(72) Inventor: Chuan Wu, Guangdong (CN)

(73) Assignees: HKC Corporation Limited, Shenzhen (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 348 days.

(21) Appl. No.: 16/248,768

(22) Filed: Jan. 15, 2019

(65) Prior Publication Data

US 2020/0103459 A1 Apr. 2, 2020

Related U.S. Application Data

(63) Continuation of application No. PCT/CN2018/113362, filed on Nov. 1, 2018.

(30) Foreign Application Priority Data

Sep. 30, 2018 (CN) .......................... 201821612449.3

(51) Int. Cl.
    *G01R 31/28* (2006.01)
    *G09G 3/36* (2006.01)

(52) U.S. Cl.
    CPC ....... *G01R 31/2825* (2013.01); *G09G 3/3696* (2013.01); *G09G 2330/12* (2013.01)

(58) Field of Classification Search
    CPC ............. G01R 31/2825; G09G 3/3696; G09G 2330/12; G09G 5/003; G09G 3/006
    USPC ................................ 324/760.02, 760.01, 537
    See application file for complete search history.

(56) References Cited

U.S. PATENT DOCUMENTS

| 2006/0156143 | A1  | 7/2006  | Tsai et al. |
| 2008/0303138 | A1* | 12/2008 | Flett ........................ H01L 25/18 257/714 |
| 2019/0139471 | A1* | 5/2019  | Lin ........................ G09G 3/3266 |
| 2019/0213936 | A1* | 7/2019  | Cho ........................ G01R 31/52 |
| 2020/0005692 | A1* | 1/2020  | Hu ........................ G09G 3/3291 |
| 2020/0211428 | A1* | 7/2020  | Wei ........................ G09G 3/3266 |
| 2020/0302840 | A1* | 9/2020  | Kim ........................ G09G 3/3233 |

FOREIGN PATENT DOCUMENTS

| CN | 102237027 A | 11/2011 |
| CN | 102636928 A | 8/2012 |
| CN | 102692776 A | 9/2012 |
| CN | 103268743 A | 8/2013 |
| CN | 103325327 A | 9/2013 |
| CN | 103345914 A | 10/2013 |
| CN | 104483795 A | 4/2015 |
| CN | 106097941 A | 11/2016 |
| CN | 107068046 A | 8/2017 |

\* cited by examiner

*Primary Examiner* — Giovanni Astacio-Oquendo

(57) ABSTRACT

The present application discloses a display panel test circuit and a display panel test device, wherein the test device of the display panel test circuit controls a plurality of switching circuits to be turned on, and a signal generator controls the plurality of switching circuits to be turned off when a first metal layer and the second metal layer are short-circuited.

20 Claims, 2 Drawing Sheets

A test signal of the display panel to the scan line pad and the data line pad to test the display panel; and

DISPLAY PANEL TEST CIRCUIT AND DISPLAY PANEL TEST DEVICE

CROSS REFERENCE TO RELATED APPLICATIONS

The present application is a Continuation Application of PCT Application No. PCT/CN2018/113362 filed on Nov. 1, 2018, which claims the benefit of Chinese Patent Application No. 201821612449.3, filed on Sep. 30, 2018, which is incorporated herein by reference in its entirety.

FIELD OF THE DISCLOSURE

The present application relates to the technical field of a display panel, and in particular, to a display panel test circuit and a display panel test device.

BACKGROUND OF THE DISCLOSURE

Panel testing refers to the simple screen test by using some traces set on the panel after cutting a single panel on a large substrate to detect some bad problems of the panel and facilitate subsequent repairs. Usually, in order to improve the detection rate, the scan lines and data lines are divided into a design of even-connected-with-odd, which are respectively connected with the test device through short-circuit rings. The test device touches the pad through the probe, and inputs the test signal into the panel to complete the test of the panel. In addition to dividing into the odd and even rows, it is also possible to divide the scan line or data line into 123/456/789 . . . that is, in units of 3 rows, or 1234/5678 . . . that is, in units of 4 rows.

After the panel test is completed, the connection between the pad and the panel requires a process, i.e., laser cutting, to disconnect all the data lines and scan lines from the short-circuit ring. In this way, a production process is added during the production process of the panel, which increases the production cost.

SUMMARY OF THE DISCLOSURE

The main purpose of the present application is to provide a display panel test circuit, which aims to solve the problem of adding a production process of laser cutting and increasing the production cost in the panel production process.

In order to achieve the above purpose, the present application provides a display panel test circuit, the display panel comprising N scan lines and M data lines, wherein the display panel test circuit comprises:

at least one scan line pad configured to corresponding connected to the N scan lines of the display panel through a short-circuit ring;

at least one data line pad configured to corresponding connected to the M data lines of the display panel through the short-circuit ring;

M first switching circuits disposed one-to-one on the N data lines;

N second switching circuits disposed one-to-one on the N scan lines;

a control pad including a first metal layer, an insulating layer and a second metal layer, the first metal layer, the insulating layer and the second metal layer being sequentially stacked, both a controlled end of the M first switching circuits and a controlled end of the N second switching circuits being connected with the first metal layer;

a test device configured to output a first control signal to the controlled end of the M first switching circuits and the controlled end of the N second switching circuits via the first metal layer to control the M first switching circuits and the N second switching circuits to be turned on, and outputs a test signal of the display panel to the scan line pad and the data line pad to test the display panel; and a signal generator configured to output a second control signal to the second metal layer, so that the second control signal is transmitted to the first metal layer when the first metal layer and the second metal layer are short-circuited to control the M first switching circuits and the N second switching circuits to be turned off, and $M>0$, $N>0$.

Optionally, the test device includes a first signal end, a second signal end, and a third signal end;

the first signal end is configured to output an analog gray scale voltage signal to the data line pad;

the second signal end is configured to output a row scan control signal to the scan line pad, thereby implementing unified charging of pixels on the display panel; and the third signal end is configured to output the first control signal to the first metal layer of the control pad to further output the first control signal to the M first switching circuits and the N second switching circuits.

Optionally, the first switching circuit and the second switching circuit are thin film transistors.

Optionally, the first control signal is at a high level, and the second control signal is at a low level.

Optionally, the voltage value of the high level is greater than or equal to 10V and less than or equal to 40V, and the voltage value of the low level is greater than or equal to −5V and less than or equal to 5V.

Optionally, the control pad further includes a glass layer disposed on a side of the second metal layer opposite the insulating layer.

Optionally, the control pad further includes a conductive protective layer disposed on a side of the first metal layer opposite the insulating layer.

Optionally, the conductive protective layer is an indium tin oxide film.

Optionally, the signal generator is electrically connected with the second metal layer through a metal line.

Optionally, a first end of the second metal layer is connected with the metal line, and a second end of the second metal layer is suspended.

The present application further provides a display panel test circuit, the display panel comprising N scan lines and M data lines, wherein the display panel test circuit comprises:

at least one scan line pad configured to corresponding connected to the N scan lines of the display panel through a short-circuit ring;

at least one data line pad configured to corresponding connected to the M data lines of the display panel through the short-circuit ring;

M first switching circuits disposed one-to-one on the N data lines;

N second switching circuits disposed one-to-one on the N scan lines;

a control pad including a first metal layer, an insulating layer and a second metal layer, the first metal layer, the insulating layer and the second metal layer being sequentially stacked, both a controlled end of the M first switching circuits and a controlled end of the N second switching circuits being connected with the first metal layer;

a test device configured to output a first control signal to the controlled end of the M first switching circuits and the controlled end of the N second switching circuits via the first metal layer to control the M first switching circuits and the N second switching circuits to be turned on, and outputs a test signal of the display panel to the scan line pad and data line pad to test the display panel;

a signal generator configured to output a second control signal to the second metal layer; and a laser configured to emit a laser signal after the display panel is tested, and fuse the first metal layer and the second metal layer to be short-circuited, so that the second control signal is transmitted to the first metal layer to control the M first switching circuits and the N second switching circuits to be turned off, and M>0, N>0.

The present application further provides a display panel test device, wherein the display panel test device comprises the display panel test circuit, the display panel including N scan lines and M data lines, the display panel test circuit including:

at least one scan line pad configured to corresponding connected to the N scan lines of the display panel through a short-circuit ring;

at least one data line pad configured to corresponding connected to the M data lines of the display panel through the short-circuit ring;

M first switching circuits disposed one-to-one on the N data lines;

N second switching circuits disposed one-to-one on the N scan lines;

a control pad including a first metal layer, an insulating layer and a second metal layer, the first metal layer, the insulating layer and the second metal layer being sequentially stacked, a controlled end of the M first switching circuits and a controlled end of the N second switching circuits being connected with the first metal layer;

a test device configured to output a first control signal to the controlled end of the M first switching circuits and the controlled end of the N second switching circuits via the first metal layer to control the M first switching circuits and the N second switching circuits to be turned on, and outputs a test signal of the display panel to the scan line pad and the data line pad to test the display panel; and a signal generator configured to output a second control signal to the second metal layer, so that the second control signal is transmitted to the first metal layer when the first metal layer and the second metal layer are short-circuited to control the M first switching circuits and the N second switching circuits to be turned off, and M>0, N>0.

Optionally, the test device includes a first signal end, a second signal end, and a third signal end;

the first signal end is configured to output an analog gray scale voltage signal to the data line pad;

the second signal end is configured to output a row scan control signal to the scan line pad, thereby implementing unified charging of pixels on the display panel; and the third signal end is configured to output the first control signal to the first metal layer of the control pad to further output the first control signal to the M first switching circuits and the N second switching circuits.

Optionally, the first switching circuit and the second switching circuit are thin film transistors.

Optionally, the first control signal is at a high level, and the second control signal is at a low level.

Optionally, the control pad further includes a glass layer disposed on a side of the second metal layer opposite the insulating layer.

Optionally, the control pad further includes a conductive protective layer disposed on a side of the first metal layer opposite the insulating layer.

Optionally, the conductive protective layer is an indium tin oxide film.

Optionally, the signal generator is electrically connected with the second metal layer through a metal line.

Optionally, a first end of the second metal layer is connected with the metal line, and a second end of the second metal layer is suspended.

The technical solution of the present application constitutes a display panel test circuit by using at least one scan line pad, at least one data line pad, M first switching circuits, N second switching circuits, control pads, a test device, and a signal generator. The M data lines of the display panel are connected to the data line pads via the M first switching circuits, and the N scan lines of the display panel are connected to the scan line pads via the N second switching circuits. The controlled end of the M first switching circuits and the controlled end of the N second switching circuits are connected with the control pad through a shorting ring. The control pad includes a first metal layer connected with the test device, an insulating layer, and a second metal layer connected with the signal generator. The test device outputs a first control signal to the controlled end of the M first switching circuits and the controlled end of the N second switching circuits via the first metal layer to control them to be turned on, and outputs a test signal to the display panel the scan line pad and data line pad through the scan line pad and the data line pad to test the display panel. After the test is completed, the first metal layer is controlled to be short-circuited with the second metal layer. The second control signal output by the signal generator is output to the controlled end of the M first switching circuits and the controlled end of the N second switching circuits via the first metal layer to control the shutdown thereof, so that the data line and the scan line of the display panel are disconnected from the short-circuit ring, thereby solving the problem of adding a production process of laser cutting and increasing the production cost in the panel production process.

BRIEF DESCRIPTION OF THE DRAWINGS

In order to illustrate the technical schemes in the embodiments of the present application or in the prior art more clearly, the drawings which are required to be used in the description of the embodiments or the prior art are briefly described below. It is obvious that the drawings described below are only some embodiments of the present application. It is apparent to those of ordinary skill in the art that other drawings may be obtained based on the structures shown in accompanying drawings without inventive effort.

With reference to the drawings, the implement of the object, features and advantages of the present application will be further illustrated in conjunction with embodiments.

DETAILED DESCRIPTION OF THE EMBODIMENTS

The technical solutions in the embodiments of the present application will be clearly and completely described hereafter in connection with the embodiments of the present application. It is apparent that the described embodiments are just a part of the embodiments of the present application, but not the whole. Based on the embodiments of the present application, all the other embodiments obtained by that of ordinary skill in the art without inventive effort are within the scope of the present application.

It should be noted that the descriptions of "first", "second" and the like in the present application are used for the purpose of description only, and are not to be construed as indicating or implying their relative importance or implicitly indicating the number of technical features indicated. Thus, features defined with "first", "second" may include at least one such feature, either explicitly or implicitly. In addition, the meaning of "and/or" appearing in the full text is: including three parallel solutions, taking "A/B" as an example, including A solution, or B solution, or the solution that A and B simultaneously satisfy. Further, the technical solutions between the various embodiments may be combined with each other, provided that those skilled in the art can implement it, and when the combination of the technical solutions is contradictory or impossible to implement, it should be considered that the combination of these technical solutions does not exist, nor is it within the scope of protection required by this application.

The present application provides a display panel test circuit 100.

Figure 1:
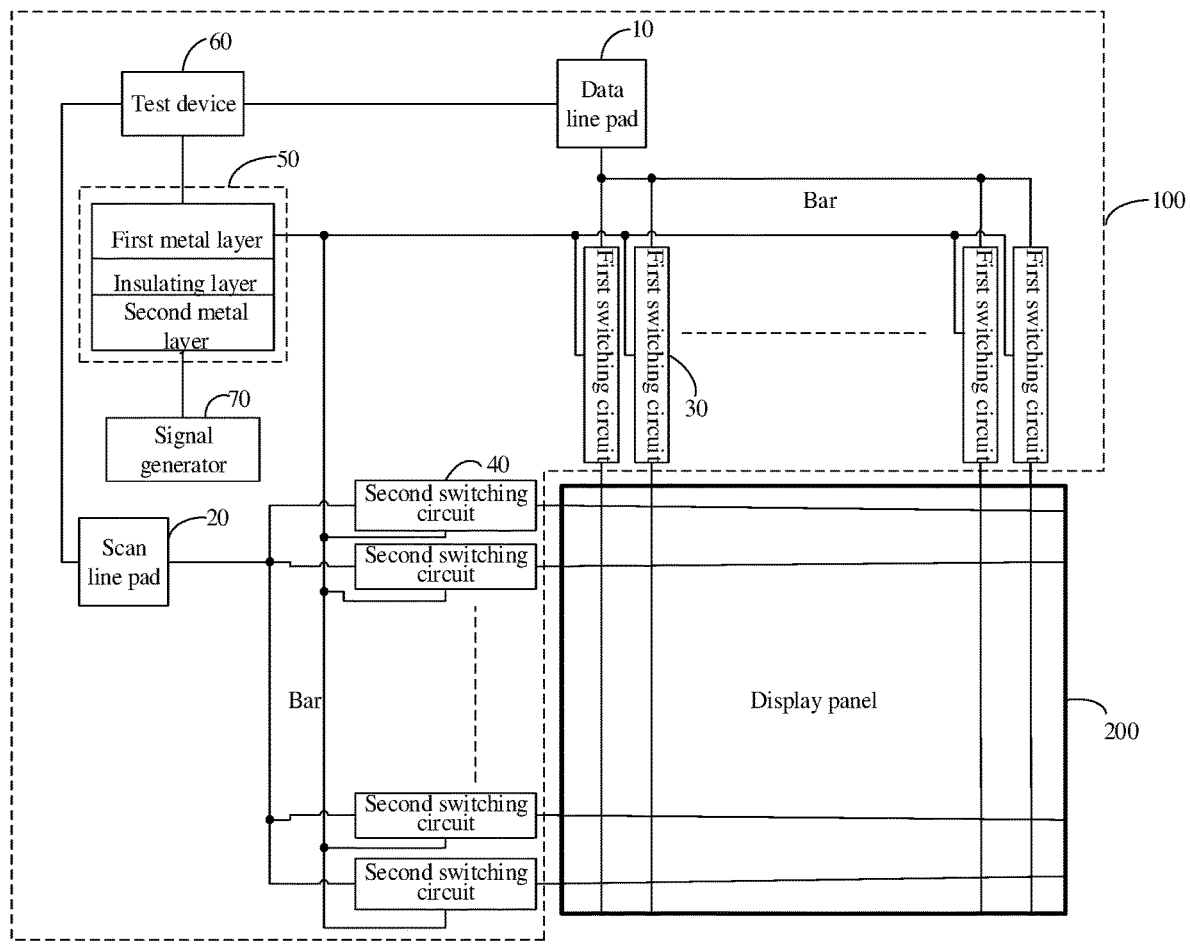
FIG. 1 is a functional block diagram of an embodiment of a display panel test circuit of the present application.

As shown in FIG. 1, FIG. 1 is a functional block diagram of an embodiment of a display panel test circuit of the present application. The present application further provides a display panel test circuit 100, the display panel 200 comprising N scan lines and M data lines, wherein the display panel test circuit 100 comprises:

at least one scan line pad 20 configured to corresponding connected to the N scan lines of the display panel 200 through a short-circuit ring B1;

at least one data line pad 10 configured to corresponding connected to the M data lines of the display panel 200 through the short-circuit ring B1;

M first switching circuits 30, the M first switching circuits 30 being disposed one-to-one on the N data lines;

N second switching circuits 40, N second switching circuits 40 being disposed one-to-one on the N scan lines;

a control pad 50, the control pad 50 including a first metal layer M1, an insulating layer P1 and a second metal layer M2, the first metal layer M1, the insulating layer P1 and the second metal layer M2 being sequentially stacked, both a controlled end of the M first switching circuits 30 and a controlled end of the N second switching circuits 40 being connected with the first metal layer M1;

a test device 60 configured to output a first control signal to the controlled end of the M first switching circuits 30 and the controlled end of the N second switching circuits 40 via the first metal layer M1 to control the M first switching circuits 30 and the N second switching circuits 40 to be turned on, and outputs a test signal of the display panel 200 to the scan line pad 20 and data line pad 10 to test the display panel 200;

a signal generator 70 configured to output a second control signal to the second metal layer M2, so that the second control signal is transmitted to the first metal layer M1 when the first metal layer M1 and the second metal layer M2 are short-circuited to control the M first switching circuits 30 and the N second switching circuits 40 to be turned off, and M>0, N>0.

In the present embodiment, the display panel 200 includes, but is not limited to, a liquid crystal display panel, an organic light emitting diode display panel, a field emission display panel, a plasma display panel, curved panel, and the liquid crystal panel includes a thin film transistor liquid crystal display panel, a TN (Twisted Nematic) panel, a VA (Vertical Alignment) panel, an IPS (In-Plane Switching) panel, and the like.

It should be noted that the number of data lines and scan lines may be set according to the size, shape or model of the display panel, M may be greater than, less than or equal to N, and M>0, N>0, which are set according to actual needs. There are no specific limitations here.

In order to achieve uniform charging detection for all pixels on the display panel 200, the respective data lines of the display panel 200 are connected with the data line pad 10 through the short-circuit ring B1, and similarly, the scan line is also connected with the scan line pad 20 through the shorting ring B1. The test device 60 then applies a test signal to the scan line pad 20 and the data line pad 10 through the probe to effect charging. The scan lines and data lines of the display panel 200 are divided into a design of even-connected-with-odd, that is, the odd rows or the odd columns of the data lines or the scan lines of the display panel 200 are connected by the same short-circuit ring B1, and the even rows or even columns are connected by the same short-circuit ring B1. The scan line pad 20 and the data line pad 10 may be correspondingly disposed. When both the data lines and the scan lines of the display panel 200 are in a design of even-connected-with-odd, the scan line pad 20 is an odd pad of scan lines and an even pad of scan lines, and the data line pad 10 is an odd pad of data lines and an even pad of data lines. In addition to dividing the scan lines and the data lines of the display panel 200 into the odd and even rows, it is also possible to divide the scan line or data line into 123/456/789 . . . that is, in units of 3 rows, or 1234/5678 . . . that is, in units of 4 rows. The scan line pad 20 and the data line pad 10 are correspondingly disposed according to the design of the data line and the scan line, and may be respectively set to three, four or more, which is not specifically limited herein.

It should be noted that the short-circuit ring B1 is configured to shield interference from external signal during the test of the display panel 200, and to avoid the influence of external signals on the internal circuit connection.

In the present embodiment, the first switching circuit 30 and the second switching circuit 40 may employ switching components or circuits having an on-off function, and the first switching circuit 30 and the second switching circuit 40 are correspondingly disposed on the data line and the scan line of the display panel 200; the signal input ends of the M first switching circuits 30 are connected to the data line pad 10 through the shorting ring B1, and the signal input ends of the N second switching circuits 40 are connected to the scan line pad 20 through the shorting ring B1; both the controlled end of the first switching circuit 30 and the controlled end of the second switching circuit 40 are connected with the control pad 50.

The control pad 50 is designed in multiple layers, and includes a first metal layer M1, an insulating layer P1, and a second metal layer M2, respectively. The first metal layer M1, the insulating layer P1, and the second metal layer M2 are stacked together, wherein the insulating layer P1 acts as an insulation to prevent the first metal layer M1 and the second metal layer M2 from being short-circuited when the test device 60 inputs a test signal, which otherwise causes the second control signal to be input to the first switching circuit 30 and the second switching circuit 40, and further causes an erroneous operation.

The first control signal is configured to control the first switching circuit 30 and the second switching circuit 40 to be turned on, and the second control signal is configured to control the first switching circuit 30 and the second switching circuit 40 to be turned off. The first control signal is output by the test device 60, and the test device 60 has a first signal end, a second signal end, and a third signal end. The first signal end is configured to output an analog gray scale voltage signal to the data line pad 10, and the second signal end is configured to output a row scan control signal to the scan line pad 20, thereby implementing unified charging of pixels on the display panel 200 to complete the test of the display panel 200. The third signal end is configured to output the first control signal to the first metal layer M1 of the control pad 50 to further output the first control signal to the M first switching circuits 30 and the N second switching circuits 40. The test device 60 may include a data driving integrated circuit configured to output an analog gray scale voltage, a scan driving integrated circuit configured to output a row scan control signal, and a signal output module outputting the first control signal. The data driving integrated circuit, the driving integrated circuit and the signal output module are integrated on the same circuit board, and are respectively connected with the pads through the probe. The test device 60 may also be configured as a single control chip to output the test signal and the first control signal, respectively. The test device 60 may be configured according to the process and the test mode, and no specific requirements are made herein.

The signal generator 70 is configured to output the second control signal, and may be configured as a single control chip or a specific circuit composed of components, and the like, and no specific requirements are made herein.

In the present embodiment, the working process of the display panel test circuit 100 is:

Before the test, the display panel 200 flows into the panel test process; the M data lines of the display panel 200 are respectively connected to the data line pad 10 through the M first switching circuits 30 one to one, and the N scan lines of the display panel 200 are respectively connected to the scan line pad 20 through the N second switching circuits 40; the controlled end of the first switching circuit 30 and the controlled end of the second switching circuit 40 are connected to the control pad 50; the control pad 50 is connected to a test device 60 and a signal generator 70, respectively, and the signal generator 70 continuously outputs the second control signal;

During the test, the test device 60 outputs a first control signal to the first metal layer M1 of the control pad 50; the M first switching circuits 30 and N second switching circuits 40 are both turned on; the test device 60 outputs a test signal to the pixels of the display panel 200 through the data line pad 10 and the scan line pad 20 for uniform charging, respectively; then the test of the display panel is completed;

After the display panel 200 is tested, the first metal layer M1 and the second metal layer M2 are short-circuited, and the short-circuiting method may be through laser welding, metal short-circuiting, or the like; when laser welding is used, the first metal layer M1 and the second metal layer M2 are fused and short-circuited, and the insulating layer P1 is broken by high temperature; the second control signal output by the signal generator 70 is output to the first switching circuit 30 and the second switching circuit 40 via the first metal layer M1, and the first switching circuit 30 and the second switching circuit 40 are turned off; the data line and the scan line of the display panel 200 are separated from the short-circuit ring B1, respectively, and the data line and the scan line of the display panel 200 may work normally. In this way, laser cutting is not required, and the panel production efficiency is improved, thereby solving the problem of adding a laser cutting production process and increasing the production cost in the panel production process.

The technical solution of the present application constitutes a display panel test circuit 100 by using at least one scan line pad 20, at least one data line pad 10, M first switching circuits 30, N second switching circuits 40, control pads 50, a test device 60, and a signal generator 70. The M data lines of the display panel 200 are connected to the data line pads 10 via the M first switching circuits 30, and the N scan lines of the display panel 200 are connected to the scan line pads 20 via the N second switching circuits 40. The controlled end of the M first switching circuits 30 and the controlled end of the N second switching circuits 40 are connected with the control pad 50 through a shorting ring B1. The control pad 50 includes a first metal layer M1 connected with the test device 60, an insulating layer P1, and a second metal layer M2 connected with the signal generator 70. The test device 60 outputs a first control signal to the controlled end of the M first switching circuits 30 and the controlled end of the N second switching circuits 40 via the first metal layer M1 to control them to be turned on, and outputs a test signal to the display panel 200 through the scan line pad 20 and the data line pad 10 to test the display panel 200. After the test is completed, the first metal layer M1 is controlled to be short-circuited with the second metal layer M2. The second control signal output by the signal generator 70 is output to the controlled end of the M first switching circuits 30 and the controlled end of the N second switching circuits 40 via the first metal layer M1 to control the shutdown thereof, so that the data line and the scan line of the display panel 200 are disconnected from the short-circuit ring B1, thereby solving the problem of adding a production process of laser cutting and increasing the production cost in the panel production process.

In an optional embodiment, the first switching circuit 30 and the second switching circuit 40 are thin film transistors.

It should be noted that the structure and working principle of the thin film transistor are similar to those of the field effect transistor, and mainly include a gate, a source and a drain, which may be divided into an N type and a P type. Assuming that the thin film transistor is an N-type transistor, a thin film transistor disposed on a data line is taken as an example, the drain of the thin film transistor is connected to the data line pad 10, and the source of the thin film transistor is connected to the display panel 200. The gate of each thin film transistor is connected with the first metal layer M1 of the control pad 50. The gate of the thin film transistor is turned on upon receiving the high level output form the test device 60, that is, the first control signal is turned on, and the test signal is input to the display panel 200 through the thin film transistor for charging test. After the test is completed, the gate of the thin film transistor is turned off at the low level output by the signal generator 70, that is, the second control signal is turned off, so that the short-circuit ring B1 is separated from the data line, and the display panel 200 may operate normally.

In an optional embodiment, the first control signal is at a high level, and the second control signal is at a low level.

In the present embodiment, the first switching circuit 30 and the second switching circuit 40 are both turned on at a high level and turned off at a low level. Generally, the voltage value of the high level is from 10V to 40V, and the voltage value of the low level is from −5V to 5V. The voltage values of the high and low levels may vary according to the switch type or the turn-on voltage selected by the first switching circuit 30 and the second switching circuit 40, and are not specifically limited herein.

Figure 2:
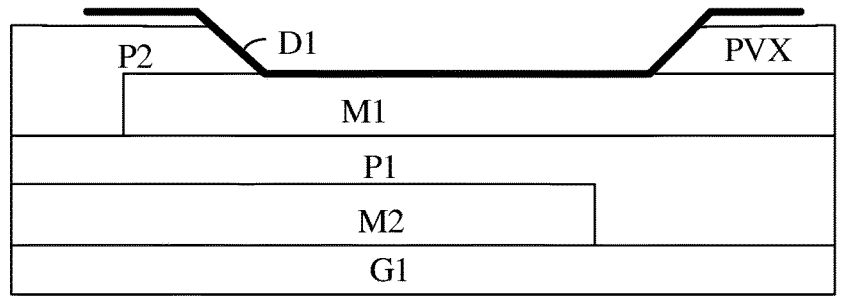
FIG. 2 is a cross-sectional view showing an embodiment of the control pad of FIG. 1.

As shown in FIG. 2, FIG. 2 is a cross-sectional view showing an embodiment of the control pad of FIG. 1. In an optional embodiment, the control pad 50 further includes a glass layer G1, and the glass layer G1 is disposed on a side of the second metal layer M2 opposite the insulating layer P1.

In the present embodiment, a glass layer G1 is further disposed below the second metal layer M2, and the second metal layer M2 is sandwiched between the insulating layer P1 and the glass layer G1; the glass layer G1 may electrically protect the second metal layer M2 from oxidation, and prevent external signals from being input into the second metal layer M2 to cause signal crosstalk; the signal generator 70 is electrically connected with the second metal layer M2 through a connection line.

In an optional embodiment, the control pad 50 further includes a D1 and the D1 is disposed on a side of the first metal layer M1 opposite the insulating layer P1.

In the present embodiment, the D1 is further disposed on the upper end surface of the first metal layer M1; the test device 60 is connected to the D1 through the probe, and is indirectly electrically connected with the second metal layer M2; the first control signal output by the test device 60 is output to each of the switching circuits via D1 and the first metal layer M1; the D1 may effectively protect the first metal layer M1 from oxidation, deformation and the like.

In an optional embodiment, the D1 is an indium tin oxide film.

It should be noted that the indium tin oxide film ITO (Indium Tin Oxides, ITO) is an n-type semiconductor material, which has high conductivity, high visible light transmission, high mechanical hardness and good chemical stability. The indium tin oxide film ITO may effectively electrostatically protect the first metal layer M1 and is connected with the test device 60 through the probe to receive the first control signal output by the test device 60.

Further, an insulating layer P2 is further disposed at one end of the upper end surface of the first metal layer M1, and the upper insulating layer P2 and the lower insulating layer P1 wrap the first metal layer M1, wherein only one end or one point is configured to be connected with the controlled end of each switching circuit via the short-circuit ring B1, and the second end of the first metal layer M1 is prevented from being connected with an external device to cause the signal crosstalk.

In an optional embodiment, the signal generator 70 is electrically connected with the second metal layer M2 through a metal line.

Figure 3:
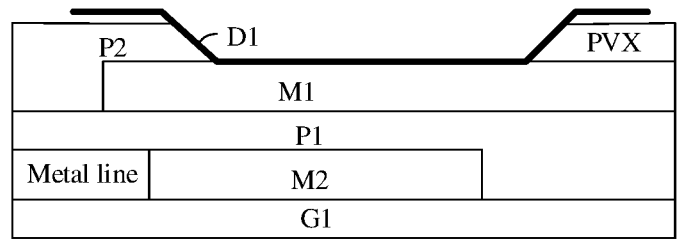
FIG. 3 is a cross-sectional view showing another embodiment of the control pad.

In the present embodiment, the metal line receives the second control signal output by signal generator 70 and may be welded to the second metal layer M2 or electrically connected with the second metal layer M2 through a via hole. As shown in FIG. 3, FIG. 3 is a cross-sectional view showing another embodiment of the control pad 50, the metal line is connected with the second metal layer M2 through the via hole, and the signal generator 70 is electrically connected with the second metal layer M2 through the metal line; the metal line may be made of aluminum line, copper line or other metal line; the metal line has the advantages of high temperature resistance, low electrical resistance, good electrical conductivity and corrosion resistance, which may effectively reduce signal attenuation.

In an optional embodiment, a first end of the second metal layer M2 is connected with the metal line, and a second end of the second metal layer M2 is suspended.

It should be noted that the second metal layer M2 is wrapped by the insulating layer P1 and the glass layer G1, wherein only one end or a point is configured to be connected with the signal generator 70 via the metal line; the second end of the second metal layer M2 is suspended to prevent the second end of the second metal layer M2 from being connected with an external device to cause the signal crosstalk.

The present application further provides a display panel test circuit 100, the display panel 200 comprising N scan lines and M data lines, wherein the display panel test circuit 100 comprises:

at least one scan line pad 20 configured to corresponding connected to the N scan lines of the display panel 200 through a short-circuit ring B1;

at least one data line pad 10 configured to corresponding connected to the M data lines of the display panel 200 through the short-circuit ring B1;

M first switching circuits 30, the M first switching circuits 30 being disposed one-to-one on the N data lines;

N second switching circuits 40, N second switching circuits 40 being disposed one-to-one on the N scan lines;

a control pad 50, the control pad 50 including a first metal layer M1, an insulating layer P1 and a second metal layer M2, the first metal layer M1, the insulating layer P1 and the second metal layer M2 being sequentially stacked, both a controlled end of the M first switching circuits 30 and a controlled end of the N second switching circuits 40 being connected with the first metal layer M1;

a test device 60 configured to output a first control signal to the controlled end of the M first switching circuits 30 and the controlled end of the N second switching circuits 40 via the first metal layer M1 to control the M first switching circuits 30 and the N second switching circuits 40 to be turned on, and outputs a test signal of the display panel 200 to the scan line pad 20 and data line pad 10 to test the display panel 200;

a signal generator 70 configured to output a second control signal to the second metal layer M2;

a laser configured to emit a laser signal after the display panel 200 is tested, and fuse the first metal layer M1 and the second metal layer M2 to be short-circuited, so that the second control signal is transmitted to the first metal layer M1 to control the M first switching circuits 30 and the N second switching circuits 40 to be turned off.

In the present embodiment, the M data lines of the display panel 200 are connected to the data line pads 10 via the M first switching circuits 30, and the N scan lines of the display panel 200 are connected to the scan line pads 20 via the N second switching circuits 40. The controlled end of the M first switching circuits 30 and the controlled end of the N second switching circuits 40 are connected with the control pad 50 through a shorting ring B1. The control pad 50 includes a first metal layer M1 connected with the test device 60, an insulating layer P1, and a second metal layer M2 connected with the signal generator 70. The test device 60 outputs a first control signal to the controlled end of the M first switching circuits 30 and the controlled end of the N second switching circuits 40 via the first metal layer M1 to control them to be turned on, and outputs a test signal to the display panel 200 through the scan line pad 20 and the data line pad 10 to test the display panel 200. After the test is completed, by welding the first metal layer M1 and the second metal layer M2 through a laser and breaking the insulating layer P1, the first metal layer M1 is short-circuited with the second metal layer M2. The second control signal output by the signal generator 70 is output to the controlled end of the M first switching circuits 30 and the controlled end of the N second switching circuits 40 via the first metal layer M1 to control the shutdown thereof, so that the data line and the scan line of the display panel 200 are disconnected from the short-circuit ring B1, thereby solving the problem of adding a production process of laser cutting and increasing the production cost in the panel production process.

The present application further provides a display panel test device, which comprises a display panel test circuit 100. The specific structure of the display panel testing circuit 100 refers to the above embodiments. Since all the technical solutions of the foregoing embodiments are used in the display panel test device, at least the technical effects brought by the technical solutions of the foregoing embodiments are included and are not described herein.

The above mentioned is only the preferred embodiment of the present application, which does not limit the patent scope of the present invention, and any equivalent structure transformation made by using the specification and the drawings of the present invention or direct/indirect applications in other related technical fields should be contained in the scope of patent protection in a similar way.

What is claimed is:

1. A display panel test circuit, the display panel comprising N scan lines and M data lines, wherein the display panel test circuit comprises:
at least one scan line pad configured to corresponding connected to the N scan lines of the display panel through a short-circuit ring;
at least one data line pad configured to corresponding connected to the M data lines of the display panel through the short-circuit ring;
M first switching circuits disposed one-to-one on the N data lines;
N second switching circuits disposed one-to-one on the N scan lines;
a control pad including a first metal layer, an insulating layer and a second metal layer, the first metal layer, the insulating layer and the second metal layer being sequentially stacked, a controlled end of the M first switching circuits and a controlled end of the N second switching circuits being connected with the first metal layer;
a test device configured to output a first control signal to the controlled end of the M first switching circuits and the controlled end of the N second switching circuits via the first metal layer to control the M first switching circuits and the N second switching circuits to be turned on, and outputs a test signal of the display panel to the at least one scan line pad and the at least one data line pad to test the display panel; and
a signal generator configured to output a second control signal to the second metal layer, so that the second control signal is transmitted to the first metal layer when the first metal layer and the second metal layer are short-circuited to control the M first switching circuits and the N second switching circuits to be turned off, and M>0, N>0.

2. The display panel test circuit according to claim 1, wherein the test device includes a first signal end, a second signal end, and a third signal end;
the first signal end is configured to output an analog gray scale voltage signal to the at least one data line pad;
the second signal end is configured to output a row scan control signal to the at least one scan line pad, thereby implementing unified charging of pixels on the display panel; and
the third signal end is configured to output the first control signal to the first metal layer of the control pad to further output the first control signal to the M first switching circuits and the N second switching circuits.

3. The display panel test circuit according to claim 1, wherein the M first switching circuits and the N second switching circuits are thin film transistors.

4. The display panel test circuit according to claim 3, wherein the first control signal is at a high level, and the second control signal is at a low level.

5. The display panel test circuit according to claim 4, wherein a voltage value of the high level is greater than or equal to 10V and less than or equal to 40V, and a voltage value of the low level is greater than or equal to −5V and less than or equal to 5V.

6. The display panel test circuit according to claim 1, wherein the control pad further includes a glass layer disposed on a side of the second metal layer opposite the insulating layer.

7. The display panel test circuit according to claim 6, wherein the signal generator is electrically connected with the second metal layer through a metal line.

8. The display panel test circuit according to claim 7, wherein a first end of the second metal layer is connected with the metal line, and a second end of the second metal layer is suspended.

9. The display panel test circuit according to claim 1, wherein the control pad further includes a conductive protective layer disposed on a side of the first metal layer opposite the insulating layer.

10. The display panel test circuit according to claim 9, wherein the conductive protective layer is an indium tin oxide film.

11. A display panel test circuit, the display panel comprising N scan lines and M data lines, wherein the display panel test circuit comprises:
at least one scan line pad configured to corresponding connected to the N scan lines of the display panel through a short-circuit ring;
at least one data line pad configured to corresponding connected to the M data lines of the display panel through the short-circuit ring;
M first switching circuits disposed one-to-one on the N data lines;
N second switching circuits disposed one-to-one on the N scan lines;
a control pad including a first metal layer, an insulating layer and a second metal layer, the first metal layer, the insulating layer and the second metal layer being sequentially stacked, both a controlled end of the M first switching circuits and a controlled end of the N second switching circuits being connected with the first metal layer;
a test device configured to output a first control signal to the controlled end of the M first switching circuits and the controlled end of the N second switching circuits via the first metal layer to control the M first switching circuits and the N second switching circuits to be turned on, and outputs a test signal of the display panel to the at least one scan line pad and the at least one data line pad to test the display panel;
a signal generator configured to output a second control signal to the second metal layer; and
a laser configured to emit a laser signal after the display panel is tested, and fuse the first metal layer and the second metal layer to be short-circuited, so that the second control signal is transmitted to the first metal layer to control the M first switching circuits and the N second switching circuits to be turned off, and M>0, N>0.

12. A display panel test device, wherein the display panel test device comprises a display panel test circuit for testing a display panel, the display panel including N scan lines and M data lines, the display panel test circuit including:
at least one scan line pad configured to corresponding connected to the N scan lines of the display panel through a short-circuit ring;
at least one data line pad configured to corresponding connected to the M data lines of the display panel through the short-circuit ring;
M first switching circuits disposed one-to-one on the N data lines;
N second switching circuits disposed one-to-one on the N scan lines;
a control pad including a first metal layer, an insulating layer and a second metal layer, the first metal layer, the insulating layer and the second metal layer being sequentially stacked, a controlled end of the M first switching circuits and a controlled end of the N second switching circuits being connected with the first metal layer;
a test device configured to output a first control signal to the controlled end of the M first switching circuits and the controlled end of the N second switching circuits via the first metal layer to control the M first switching circuits and the N second switching circuits to be turned on, and outputs a test signal of the display panel to the at least one scan line pad and the at least one data line pad to test the display panel; and
a signal generator configured to output a second control signal to the second metal layer, so that the second control signal is transmitted to the first metal layer when the first metal layer and the second metal layer are short-circuited to control the M first switching circuits and the N second switching circuits to be turned off, and M>0, N>0.

13. The display panel test device according to claim 12, wherein the test device includes a first signal end, a second signal end, and a third signal end;
the first signal end is configured to output an analog gray scale voltage signal to the at least one data line pad;
the second signal end is configured to output a row scan control signal to the at least one scan line pad, thereby implementing unified charging of pixels on the display panel; and
the third signal end is configured to output the first control signal to the first metal layer of the control pad to further output the first control signal to the M first switching circuits and the N second switching circuits.

14. The display panel test device according to claim 12, wherein the M first switching circuits and the N second switching circuits are thin film transistors.

15. The display panel test device according to claim 14, wherein the first control signal is at a high level, and the second control signal is at a low level.

16. The display panel test device according to claim 12, wherein the control pad further includes a glass layer disposed on a side of the second metal layer opposite the insulating layer.

17. The display panel test device according to claim 16, wherein the signal generator is electrically connected with the second metal layer through a metal line.

18. The display panel test device according to claim 17, wherein a first end of the second metal layer is connected with the metal line, and a second end of the second metal layer is suspended.

19. The display panel test device according to claim 12, wherein the control pad further includes a conductive protective layer disposed on a side of the first metal layer opposite the insulating layer.

20. The display panel test device according to claim 19, wherein the conductive protective layer is an indium tin oxide film.

* * * * *